United States Patent [19]

Nogle et al.

[11] Patent Number: 4,928,268
[45] Date of Patent: May 22, 1990

[54] MEMORY USING DISTRIBUTED DATA LINE LOADING

[75] Inventors: Scott G. Nogle; Perry H. Pelley, III; Stephen T. Flannagan; Bruce E. Engles, all of Austin, Tex.

[73] Assignee: Motorola, Inc., Schaumburg, Ill.

[21] Appl. No.: 342,160

[22] Filed: Apr. 21, 1989

[51] Int. Cl.⁵ .............................................. G11C 8/00
[52] U.S. Cl. ................................................ 365/230.03
[58] Field of Search .................................... 365/230.03

[56] References Cited

U.S. PATENT DOCUMENTS

| | | | |
|---|---|---|---|
| 4,698,788 | 10/1987 | Flannagan et al. | 365/203 |
| 4,760,561 | 7/1988 | Yamamoto et al. | 365/190 |
| 4,807,191 | 2/1989 | Flannagan | 365/230.03 |

Primary Examiner—James W. Moffitt
Attorney, Agent, or Firm—Paul J. Polansky

[57] ABSTRACT

A memory which contains a global data line pair and a plurality of loads for the global data line pair distributed thereon. The global data lines run the length of the memory, and are connected to a set of arrays distributed along the global data lines, of which each array provides a voltage on the global data lines when selected. The first load is located above the first array and the last is located below the last array. Other global data line loads are placed between consecutive arrays. In a read mode of operation a pair of loads associated with each array is enabled when a corresponding array is selected. Placement of the loads in this manner decreases an access time considerably.

14 Claims, 2 Drawing Sheets

MEMORY USING DISTRIBUTED DATA LINE LOADING

FIELD OF THE INVENTION

This invention relates generally to integrated circuit memories, and more particularly, to memories which have a resistive data output line to which a large number of outputs are coupled.

BACKGROUND OF THE INVENTION

Static random access memories designed as integrated circuits require increasingly shorter access times to stay commercially competitive. Shorter access times present difficulties, however. The memory blocks inside the integrated circuit are laid out in repeated cell structures, which conveniently use common lines for data inputs and outputs, which can present a difficulty in that even though these lines are metal, they act as transmission lines with significant resistance and parasitic capacitance. These long lines create large time constants for signals to reach their steady-state values and limit how fast the memory can be accessed. The high resistance also causes significant voltage differences in data signals between the case in which a memory block located at one end of the transmission line is accessed and the case in which a memory block at the other end is accessed, making the data signals more difficult to sense.

BRIEF DESCRIPTION OF THE INVENTION

Accordingly, it is an object of the present invention to provide a memory with improved data line loading.

It is another object of the present invention to provide improved loading along common data lines in a memory.

It is yet another object to provide an improved method of loading data lines to improve memory access time.

In carrying out these and other objects of the invention, there is provided, in one form, a memory with two global data lines running from the top of the memory to the bottom. The global data lines provide an output bit and its complement. Attached to the global data lines are several memory blocks, which are grouped into a first array and a second array. In a read mode, each memory block may be selected, and depending on which array the selected memory block is contained in, a first or third global data line load is switched onto the global data lines. In the read mode a second load is always on when a memory block is selected.

These and other objects, features and advantages will be more clearly understood from the following detailed description taken in conjunction with the accompanying drawings.

DETAILED DESCRIPTION OF THE INVENTION

Figure 1:
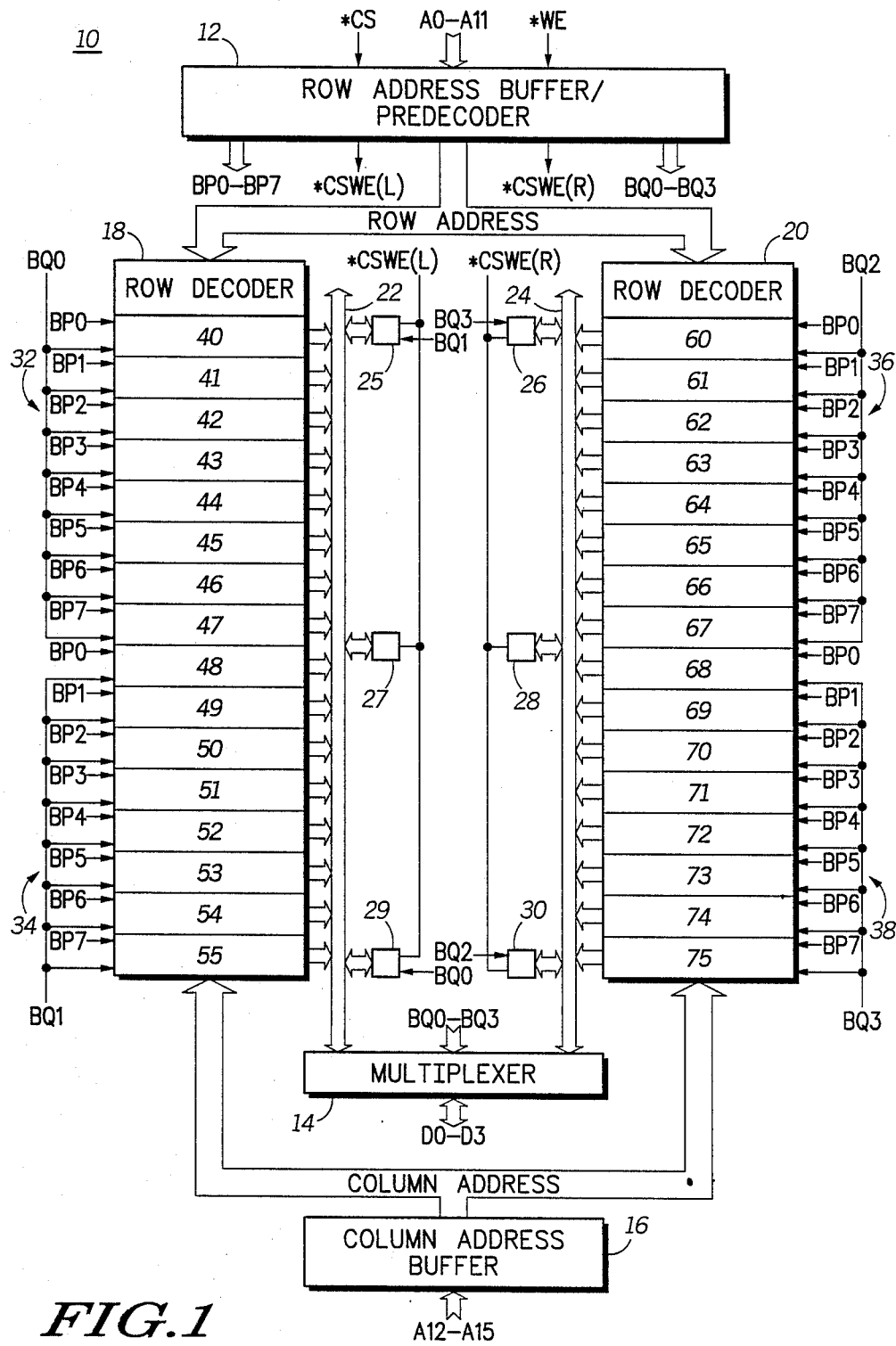
FIG. 1 illustrates in block form a memory in accordance with the present invention.

Shown in the FIG. 1 is a memory 10 generally comprising a row address buffer/predecoder 12, a multiplexer 14, a column address buffer 16, a first row decoder 18, a second row decoder 20, a first set of global data lines 22, a second set of global data lines 24, global data line load sets 25, 26, 27, 28, 29, and 30, a first array 32, a second array 34, a third array 36, and a fourth array 38. First set of global data lines 22 comprises four global data line pairs, each pair including a true global data line and a complementary global data line. Second set of global data lines 24 comprises four global data line pairs, each pair including a true global data line and a complementary global data line. First array 32 comprises memory blocks 40, 41, 42, 43, 44, 45, 46, and 47. Second array 34 comprises memory blocks 48, 49, 50, 51, 52, 53, 54, and 55. Third array 36 comprises memory blocks 60, 61, 62, 63, 64, 65, 66, and 67. Fourth array 38 comprises memory blocks 68, 69, 70, 71, 72, 73, 74, and 75.

Row address buffer/predecoder 12 receives row address signals A0, A1, A2, A3, A4, A5, A6, A7, A8, A9, A10, and A11, chip select signal *CS, and write mode signal *WE. Row address buffer/predecoder 12 provides memory block select signals BP0, BP1, BP2, BP3, BP4, BP5, BP6, and BP7, chip select/write signals *CSWE(L) and *CSWE(R), array select signals BQ0, BQ1, BQ2, and BQ3, and a buffered row address signal. An asterisk (*) in front of a signal designation indicates that that signal is active at a logic low. Column address buffer 16 receives column address signals A12, A13, A14, and A15, and outputs a buffered column address. Multiplexer 14 receives signals BQ0-BQ3 and is coupled to sets of global data lines 22 and 24. In a read mode of memory 10, multiplexer 14 receives global data line signals GDL(0) and *GDL(0), GDL(1) and *GDL(1), GDL(2) and *GDL(2), and GDL(3) and *GDL(3) from first set of global data lines 22, and global data line signals GDL(4) and *GDL(4), GDL(5) and *GDL(5), GDL(6) and *GDL(6), and GDL(7) and *GDL(7) from second set of global data lines 24. Multiplexer 14 outputs data signals D0, D1, D2, and D3 in the read mode, and receives data input signals D0-D3 in a write mode of memory 10. First row decoder 18 receives the buffered row address and selectively provides 64 global word line driver signals and a buffered row address signal to memory blocks 40-55. Second row decoder 20 receives the buffered row address and selectively provides 64 global word line driver signals and a buffered row address signal to memory blocks 60-75.

Array 32 is located immediately above array 34, and to the left of arrays 36 and 38. Memory blocks within array 32 are placed sequentially below one another, with memory block 40 at the top of array 32, memory block 41 below memory block 40, etc. Memory block 47 is at the bottom of array 32. Memory blocks within array 34 are placed sequentially below one another, with memory block 48 at the top of array 34, memory block 49 below memory block 48, etc. Memory block 55 is at the bottom of array 34. Array 36 is located immediately above array 38. Memory blocks within array 36 are placed sequentially below one another, with memory block 60 at the top of array 36, memory block 61 below memory block 60, etc. Memory block 67 is at the bottom of array 36. Memory blocks within array 38 are placed sequentially below one another, with memory block 68 at the top of array 38, memory block 69 below memory block 68, etc. Memory block 75 is at the bottom of array 38. First set of global data lines 22 begins at the top of array 32 and runs below the bottom of array 34, where it connects with multiplexer 14. Second set of global data lines 24 begins at the top of array 36 and runs below the bottom of array 38, where it connects with multiplexer 14.

Global data line load set 25 connects to first set of global data lines 22 at the top of array 32. Below global data line load set 25 memory blocks 40-47 in first array 32 connect to first set of global data lines 22. Below first array 32 global data line load set 27 connects to first set of global data lines 22. Below global data line load set 27 memory blocks 48-55 in second array 34 connect to first set of global data lines 22. Below second array 34 global data line load set 29 connects to first set of global data lines 22. Multiplexer 14 connects to first set of global data lines 22. In the read mode, multiplexer 14 receives signals GDL(0)/*GDL(0)-GDL(3)/*GDL(3) on the four global data line pairs contained in first set of global data lines 22.

Global data line load set 26 connects to second set of global data lines 24 at the top of array 36. Below global data line load set 26 memory blocks 60-67 in third array 36 connect to second set of global data lines 24. Below third array 36 global data line load set 28 connects to second set of global data lines 24. Below global data line load set 28 memory blocks 68-75 in fourth array 38 connect to second set of global data lines 24. Below fourth array 38 global data line load set 30 connects to second set of global data lines 24. Multiplexer 14 connects to second set of global data lines 24. In the read mode, multiplexer 14 receives signals GDL(4)/*GDL(4)-GDL(7)/*GDL(7) on the four global data line pairs contained in second set of global data lines 24.

Global data line load set 25 receives array select signal BQ1 and chip select/write signal *CSWE(L). Global data line load set 27 receives chip select/write signal *CSWE(L). Global data line load set 29 receives array select signal BQ0 and chip select/write signal *CSWE(L). Global data line load set 26 receives array select signal BQ3 and chip select/write signal *CSWE(R). Global data line load set 28 receives chip select/write signal *CSWE(R). Global data line load set 30 receives array select signal BQ2 and chip select/write signal *CSWE(R).

Array 32 is selected when signal BQ0 is a logic high. One of memory blocks 40-47 is selected when array 32 is selected. The particular memory block 40-47 within array 32 which is selected is selected when its corresponding signal of signals BP0-BP7 is a logic high. In array 32, memory blocks 40-47 connect to first row decoder 18 and to column address buffer 16. Memory blocks 40-47 receive memory block select signals BP0-BP7, respectively. Each of memory blocks 40-47 receives array select signal BQ0 from row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 34 is selected when signal BQ1 is a logic high. One of memory blocks 48-55 is selected when array 34 is selected. The particular memory block 48-55 within array 34 which is selected is selected when its corresponding signal of signals BP0-BP7 is a logic high. In array 34, memory blocks 48-55 connect to first row decoder 18 and to column address buffer 16. Memory blocks 48-55 receive memory block select signals BP0-BP7, respectively. Each of memory blocks 48-55 receives array select signal BQ1 from row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 36 is selected when signal BQ2 is a logic high. One of memory blocks 60-67 is selected when array 36 is selected. The particular memory block 60-67 within array 36 which is selected when its corresponding signal of signals BP0-BP7 is a logic high. In array 36, memory blocks 60-67 connect to second row decoder 20 and to column address buffer 16. Memory blocks 60-67 receive memory block select signals BP0-BP7, respectively. Each of memory blocks 60-67 receives array select signal BQ2 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

Array 38 is selected when signal BQ3 is a logic high. One of memory blocks 68-75 is selected when array 38 is selected. The particular memory block 68-75 within array 38 which is selected when its corresponding signal of signals BP0-BP7 is a logic high. In array 38, memory blocks 68-75 connect to second row decoder 20 and to column address buffer 16. Memory blocks 68-75 receive memory block select signals BP0-BP7, respectively. Each of memory blocks 68-75 receives array select signal BQ3 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

In operation, memory 10 allows memory cells located within memory blocks 40-55 and 60-75 to be read from and written to. During write cycles, multiplexer 14 receives data signals D0-D3 and supplies them to the appropriate memory block based on the address A0-A15. In a write mode, when a memory block on a left side of memory 10 comprising blocks in arrays 32 or 34 is being written to, *CSWE(L) is low and global data line load sets 25, 27, and 29 are disabled. Global data line load sets 26, 28, and 30 are enabled, however, to prevent the second set of global data lines from assuming an indeterminate state. When a memory block on a right side of memory 10 is being written to, *CSWE(R) is low and global data line load sets 26, 28, and 30 are disabled. Global data line load sets 25, 27, and 29 are enabled, however, to prevent the first set of global data lines from assuming an indeterminate state.

In the read mode, memory 10 provides four bits of data represented by data signals D0–D3 selected by address signals A0–A15. Column address buffer 16 buffers incoming address signals A12–A15 and outputs them to memory blocks 40–55 and 60–75. Row address buffer/predecoder 12 decodes row address lines A0–A11, chip select signal *CS, and write mode signal *WE. In response, it supplies signals BP0–BP7, BQ0–BQ3, *CSWE(L) and *CSWE(R), and a row address to row decoders 18 and 20. Signals BP0–BP7 select one of eight memory blocks of each array 32, 34, 36, and 38. Signals BQ0–BQ3 select which one of the four arrays 32, 34, 36, and 38 is selected. Together, signals BP0–BP7 and signals BQ0–BQ3 select one memory block of 32 memory blocks of the set 40–55 and 60–75. *CSWE(L) is true if both *CS and *WE are true and a left side comprising arrays 32 and 34 is selected, and indicates that memory 10 is in the write mode, that memory 10 is active, and that the global data line loads connected to first set of global data lines 22 should be disabled. *CSWE(R) is true if both *CS and *WE are true and a right side comprising arrays 36 and 38 is selected, and indicates that memory 10 is in the write mode, that memory 10 is active, and that the global data line loads connected to second set of global data lines 24 should be disabled.

The buffered row address is input to first row decoder 18 and second row decoder 20. In response to receiving the buffered row address, first row decoder 18 drives 64 global word lines to memory blocks 40–55 and second row decoder 20 drives 64 global word lines to memory blocks 60–75. The word lines, along with the column address and the buffered row address signal, are further decoded in the memory blocks themselves. After a particular memory block is selected by BP0–BP7 and BQ0–BQ3, the memory block combines the 64 global word lines and the buffered row address signal and drives 128 local word lines. The memory block decodes the column address along with the selected word line and selects one memory cell for each of four pairs of global data lines. The four memory cells output four data bits and the complements of the four data bits onto the first set of global data lines 22 if the memory block selected is located in either first array 32 or second array 34, or outputs four data bits and the complements of the four data bits onto the second set of global data lines 24 if the memory block selected is located in first array 36 or second array 38. Multiplexer 14 receives signals GDL(0)/*GDL(0)–GDL(3)/*GDL(3) from first set of global data lines 22 and signals GDL(4)/*GDL(4)–GDL(7)/*GDL(7) from second set of global data lines 24 and forms and buffers outputs D0–D3 in response. Multiplexer 14 receives signals BQ0–BQ3 and in response derives D0–D3 from signals GDL(0)/*GDL(0)–GDL(3)/*GDL(3) if a memory block in the first array 32 or second array 34 is selected by BQ0 or BQ1, respectively, or from signals GDL(4)/*GDL(4)–GDL(7)/*GDL(7) if a memory block in the third array 36 or fourth array 38 is selected by BQ2 or BQ3, respectively.

When a read access takes place, a selected memory block outputs signals on four global data line pairs. Each global data line pair appears as a pair of transmission lines. The selected memory block outputs signals on each long transmission line using a differential transconductance amplifier, which receives a sensed differential voltage from a selected memory cell and outputs a differential current in response. The global data line loads source the current and thereby convert the output of the transconductance amplifiers to a voltage, so that the signals GDL(0)/*GDL(0)–GDL(7)/*GDL(7) form eight differential voltage pairs.

The particular global data line load sets selected depends on which array contains a memory block which is selected. If first array 32 or second array 34 is selected during a read access, signal *CSWE(L) is high. During a memory access in which *CSWE(L) is high, global data line load set 27 is always selected. Which one of global data line load set 25 and global data line load set 29 is selected is determined by whether a memory block in first array 32 or second array 34 is selected. If a memory block in first array 32 is selected, BQ0 is high, BQ1–BQ3 are low, global data line load set 25 is enabled, and global data line load set 29 is disabled. If a memory block in second array 34 is selected, BQ1 is high, BQ0 and BQ2–BQ3 are low, global data line load set 29 is enabled, and global data line load set 25 is disabled.

Similarly, if third array 36 or fourth array 38 is selected during a read access, signal *CSWE(R) is high. During a memory access in which *CSWE(R) is high, global data line load set 28 is always selected. Which of global data line load set 26 and global data line load set 30 is selected is determined by whether a memory block in third array 36 or fourth array 38 is selected. If a memory block in third array 36 is selected, BQ2 is high, BQ0, BQ1, and BQ3 are low, global data line load set 26 is enabled, and global data line load set 30 is disabled. If a memory block in fourth array 38 is selected, BQ3 is high, BQ0–BQ2 are low, global data line load set 30 is enabled, and global data line load set 26 is disabled.

Figure 2:
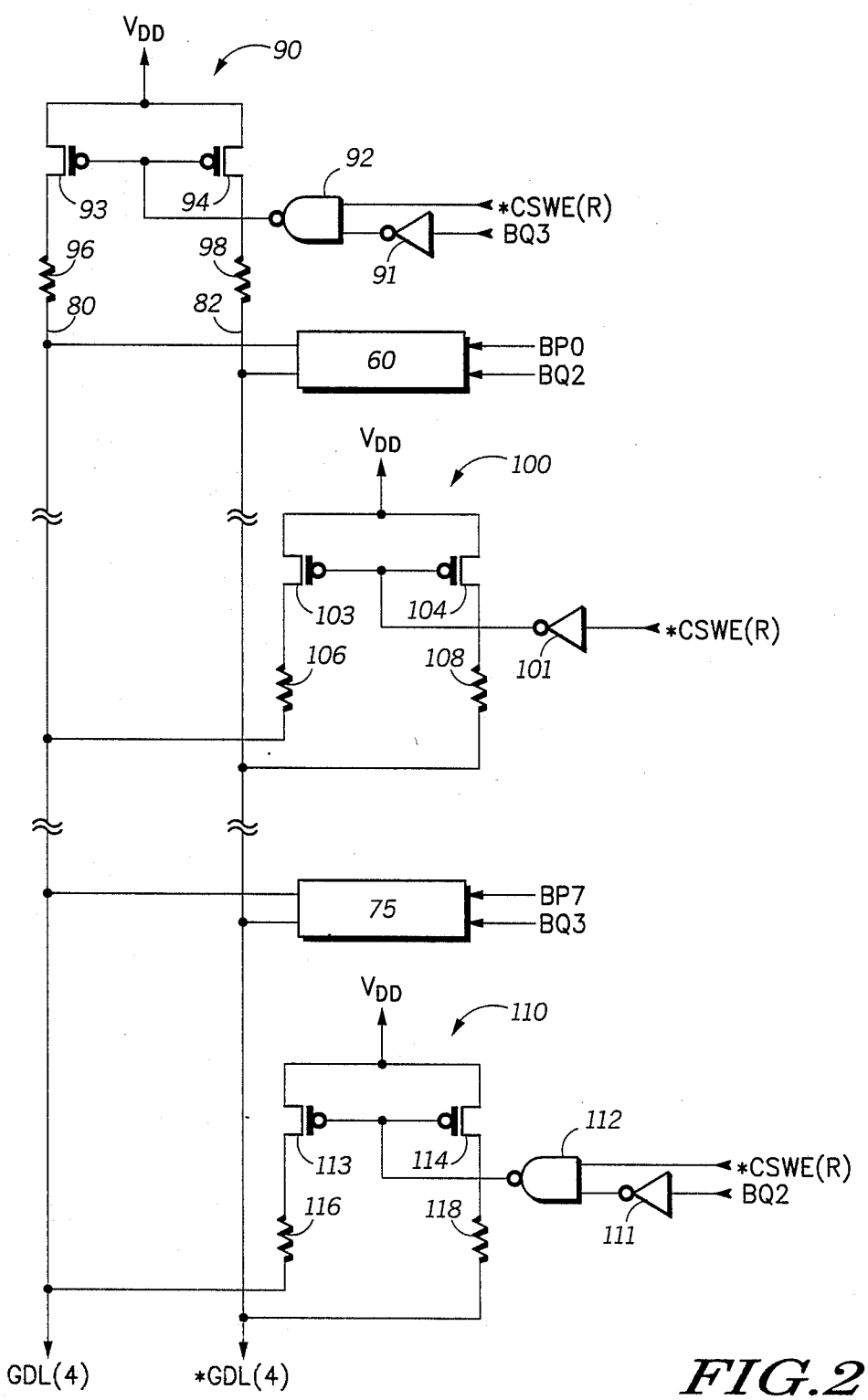
FIG. 2 illustrates a portion of the memory shown in FIG. 1 that relates to the current invention in greater detail.

FIG. 2 diagrams one pair of global data lines and the corresponding loads of memory 10 of FIG. 1 and demonstrates the advantage of the global data line load placement and selection method in the present invention over the prior art. Shown in FIG. 2 is a pair of global data lines 80 and 82 of second set of global data lines 24, supplying a pair of signals GDL(4) and *GDL(4), respectively. Pair of global data lines 80 and 82 shown in FIG. 2 is representative of each of the four pairs of global data lines in first set of global data lines 22 and each of the four pairs of global data lines in second set of global data lines 24. FIG. 2 generally comprises pair of global data lines 80 and 82, global data line load 90 which is a portion of global data line load set 26 of FIG. 1, memory block 60, global data line load 100 which is a portion of global data line load set 28 of FIG. 1, memory block 75, and global data line load 110 which is a portion of global data line load set 30 of FIG. 1, inverter 91, NAND gate 92, inverter 101, inverter 111, and NAND gate 112. All memory blocks 60–67 in third array 36 and 68–75 in fourth array 38 connect and supply outputs to pair of global data lines 80 and 82, but are omitted for ease of illustration.

Global data line load 90 connects to global data lines 80 and 82 above memory block 60. Global data line load 100 connects to global data lines 80 and 82 below memory block 67 and above memory block 68. Global data line load 110 connects to global data lines 80 and 82 below memory block 75.

Inverter 91 has an input for receiving signal BQ3, and an output. NAND gate 92 has a first input for receiving input signal *CSWE(R), a second input coupled to the output of inverter 91, and an output. Global data line load 90 comprises a p-channel transistor 93, a p-channel transistor 94, a resistor 96, and a resistor 98. Transistor 93 has a source for connecting to $V_{DD}$, a gate coupled to the output of NAND gate 92, and a drain. Transistor 94 has a source for connecting to $V_{DD}$, a gate coupled to the output of NAND gate 92, and a drain. Resistor 96 has a first terminal coupled to the drain of transistor 93 and a second terminal coupled to global data line 80 at the top. Resistor 98 has a first terminal coupled to the drain of transistor 94 and a second terminal coupled to global data line 82 at the top. The output of NAND gate 92 also connects to other global data line loads in global data line load set 26 in a similar fashion.

Memory block 60 receives input signals BP0 and BQ2, 64 global word lines from second row decoder 20, a buffered row address signal, and a buffered column address from column address buffer 16. Memory block 60 is coupled to both global data lines 80 and 82. Other memory blocks 61-67 of third array 36 are located from top to bottom consecutively below memory block 60 and above global data line load 100 and are omitted for brevity.

Inverter 101 has an input for receiving signal *CSWE(R), and an output. Global data line load 100 comprises a p-channel transistor 103, a p-channel transistor 104, a resistor 106, and a resistor 108. Transistor 103 has a source connected to $V_{DD}$, a gate coupled to the output of inverter 101, and a drain. Transistor 104 has a drain connected to $V_{DD}$, a gate coupled to the output of inverter 101, and a source. Resistor 106 has a first terminal coupled to the drain of transistor 103 and a second terminal coupled to global data line 80 below memory block 67 and above memory block 68. Resistor 108 has a first terminal coupled to the drain of transistor 104 and a second terminal coupled to global data line 82 below memory block 67 and above memory block 68. The output of inverter 101 also connects to other global data line loads in global data line load set 28 in a similar fashion.

Memory block 75 receives input signals BP7 and BQ3, 64 global word lines from second row decoder 20, a buffered row address signal, and a buffered column address from column address buffer 16. Memory block 75 is coupled to both global data lines 80 and 82. Other memory blocks 68-74 of fourth array 38 are located from top to bottom consecutively above memory block 75, and are omitted for brevity.

Inverter 111 has an input for receiving signal BQ2 and an output. NAND gate 112 has a first input for receiving signal *CSWE(R), a second input coupled to the output of inverter 111, and an output. Global data line load 110 comprises a p-channel transistor 113, a p-channel transistor 114, a resistor 116, and a resistor 118. Transistor 113 has a source connected to $V_{DD}$, a gate coupled to the output of NAND gate 112, and a drain. Transistor 114 has a source connected to $V_{DD}$, a gate coupled to the output of NAND gate 112, and a source. Resistor 116 has a first terminal coupled to the drain of transistor 113 and a second terminal coupled to global data line 80 below memory block 75. Resistor 118 has a first terminal coupled to the drain of transistor 114 and a second terminal coupled to global data line 82 below memory block 75. The output of NAND gate 112 also connects to other global data line loads in global data line load set 30 in a similar fashion.

This distributed-load approach is superior to having a single load for the entire global data line. In operation, the placement and selection of global data line loads 90, 100, and 110 of memory 10 based on the selected memory block speed up access time by decreasing, over the single-load approach, the worst case resistance from a memory block to $V_{DD}$. Access time also improves because the present invention decreases the variation, due to the variation in location of the selected cell, in differential voltage at the input of multiplexer 14 significantly over the single-load approach. Finally the distributed loading decreases the maximum current density in the global data lines, for given metal line dimensions. Each memory block 40-55 connects to the four pairs of global data lines in first set of global data lines 22 through four differential transconductance amplifiers contained in each block. Each memory block 60-75 connects to the four pairs of global data lines in second set of global data lines 24 through four differential transconductance amplifiers. Each differential transconductance amplifier senses a differential voltage output from an enabled memory cell and supplies a differential current to the pair of global data lines connected to it. The global data line loads convert the differential current driven onto the global data line pairs into a differential voltage to supply to multiplexer 14.

In the read mode, if memory block 60 is selected, *CSWE(R) is high, BQ2 is high, and BQ0-BQ1 and BQ3 are low. The output of inverter 91 is high, and since both inputs are high, the output of NAND gate 92 is low. The low output of NAND gate 92 is driven onto the gates of p-channel transistors 93 and 94, turning them on. A current driven through the differential transconductance amplifier located in memory block 60 may now be supplied through transistors 93 and 94, converting global data line signals GDL(4) and *GDL(4) of global data lines 80 and 82 into a differential voltage. *CSWE(R) also causes the output of inverter 101 to be low, driving a low voltage onto the gates of p-channel transistors 103 and 104 and turning them on. Global data line load 100 therefore provides a second path to conduct the differential current driven by the transconductance amplifier in memory block 60. Finally, BQ2 drives the output of inverter 111 low, making the output of NAND gate 112 high, and turning off transistor 113 and transistor 114.

Global data lines 80 and 82 are fabricated using metal lines. These metal lines can be modeled as transmission lines with a distributed resistance and capacitance. Using two enabled global data line loads for a selected memory block decreases the effect of the resistance in the metal transmission lines over the case in which a single load is placed on each global data line.

The three distributed loads improve the access time over that which would occur if there were only one load at one end of the global data line. Consider the single-load approach in which a single load is located at one end of a global data line. Let the resistance of the load denoted by $R_L$ have a value $R_1$. Further let the parasitic resistance of the metal line from one end to the other end to which the load is connected have a value of $R_M$. If a memory block is selected on the same end of the metal line as the load, the resistance between the amplifier and $V_{DD}$ is essentially $R_1$. If, on the other hand, a memory block at the opposite end of the metal line from the load is selected, the resistance to $V_{DD}$ would be $(R_1+R_M)$. Further, consider the difference in voltage on the global data line between the case in which a memory block on the same end as the load is selected and in which one at the opposite end is selected. For the memory block at the same end as the load, the voltage drop on the global data line is equal to $R_1$ times the current through the transconductance amplifier in the selected memory block. For the opposite end, the voltage drop on the global data line is equal to $(R_1+R_M)$ times the current. The difference in voltage drop between the two memory blocks is equal to $R_M$ times the current. The current is essentially the same for both cases because the transconductance amplifier acts as a current source. Thus, the voltage differential between the two cases is proportional to $R_M$.

Consider now the case of the preferred embodiment of two enabled global data line loads, as shown in FIG. 2. The condition for lowest resistance to $V_{DD}$ occurs if a selected memory block is located immediately adjacent to a global data line load, for example memory block 60. When memory block 60 is selected, global data line loads 90 and 100 are enabled. Let $R_L$ equal the resistance of each of the loads on each global data line. In FIG. 2, the resistance through global data line load 90 on global data line 82, $R_L$, would be equal to the resistance of transistor 94 plus the resistance of resistor 98. As before, $R_M$ is the resistance of each metal line which in FIG. 2 are global data lines 80 and 82. The resistance from memory block 60 to $V_{DD}$ is essentially equal to $R_L$ in parallel with $(R_L+(\frac{1}{4})R_M)$. The lowest resistance is thus $(R_L^2+(\frac{1}{4})R_LR_M)/(2R_L+(\frac{1}{4})R_M)$. The theoretical condition for highest resistance to $V_{DD}$ from the selected block occurs when the selected block is midway between two loads. Since there are eight memory blocks between two loads, the actual highest resistance is slightly less than the theoretical highest resistance because the fourth memory block is located above the midpoint and the fifth memory block is located below the midpoint. The highest theoretical resistance is $(R_L+(\frac{1}{4})R_M)$ in parallel with $(R_L+(\frac{1}{4})R_M)$, or $(R_L^2+(\frac{1}{2})R_LR_M+(1/16)R_M^2)/(2R_L+(\frac{1}{2})R_M)$. The difference between the highest and the lowest is thus $((1/16)R_M^2)/(2R_L+(\frac{1}{2})R_M)$, compared with a difference of $R_M$ for the single-load approach. $R_L$, in the preferred embodiment, is larger than $R_M$, but even if $R_L$ is only equal to $(\frac{3}{4})R_M$, the difference between the highest and lowest resistance is only $(1/32)R_M$. This difference is even less if $R_L$ is greater than $(\frac{3}{4})R_M$. Thus, when $R_L$ is greater than $R_M$, the maximum voltage difference that can occur due to the variation in location of the selected block is less than the amplifier current times $(1/32)R_M$. In the single-load approach, the maximum variation is the amplifier current times $R_M$. Thus, the approach of the preferred embodiment provides at least a factor of 32 improvement in voltage variation due to variation in selected block location.

Comparing the two approaches also shows that the distributed-load approach decreases the highest resistance to $V_{DD}$. In such case, $R_L$ equals $2R_1$. The worst case resistance to $V_{DD}$ in the present invention is equal to $((\frac{1}{2})R_L+(\frac{1}{8})R_M)=((\frac{1}{2})(2R_1)+(\frac{1}{8})R_M)=(R_1+(\frac{1}{8})R_M)$, which is always less than $(R_1+R_M)$, the highest resistance case for the single-load approach.

Also, the current density on the global data lines is reduced by distributing the loads. Transconductance amplifiers in selected memory blocks source a constant current. In the preferred embodiment, any given portion of a global data line which is carrying current, carries approximately one half of the amplifier current. Whereas, in the single-load approach, any portion of a global data line which is carrying current carries the entire amplifier current.

The lower worst case resistance to $V_{DD}$ and the lower variation in voltage due to the position of the selected block along the global data line both improve access time in the present invention over the single-load case. In addition, a decrease in current in a given portion of a data line achieved by using distributed global data line loading allows the use of narrower metal lines for the global data lines for a given current density or a reduction in current density for a given metal line dimension.

By now it should be apparent that a memory has been provided which reduces access time by distributing loads along the global data lines. By distributing the loads the output signal on the global data lines achieves its value faster, because the resistance between the memory block output and the supply voltage is reduced. The apparatus and placement method for the global data line loads has been described, and many variations not described herein are possible.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A memory having a top and a bottom, comprising:
a pair of global data lines running from the top of the memory to the bottom;
an array set consisting of a plurality of arrays, including a first array and a last array, distributed along the length of the global data lines of said memory, said arrays having a top and a bottom, said arrays providing a pair of complementary signals to the global data lines when selected;
array selection means, coupled to the plurality of arrays, for selecting an array from the set of arrays;
at least three loads, coupled to the pair of global data lines, distributed substantially evenly along said pair of global data lines.

2. A memory having a top and a bottom, comprising:
a pair of global data lines running from the top of the memory to the bottom;
an array set consisting of a plurality of arrays, including a first array and a last array, distributed along the length of the global data lines of said memory, said arrays having a top and a bottom, said arrays providing a pair of complementary signals to the global data lines when selected;
array selection means, coupled to the plurality of arrays, for selecting an array from the set of arrays;
a plurality of loads, coupled to the global data lines, wherein there is a pair of loads associated with each array, said pair of loads being enabled when the array with which it is associated is selected.

3. The memory of claim 2 wherein each of said plurality of loads further comprises:
a first transistor having a first current electrode coupled to a first power supply voltage terminal, a control electrode, and a second current electrode;
a first resistor having a first terminal coupled to the second current electrode of the first transistor, and a second terminal connected to a first global data line of said pair of global data lines;
a second transistor having a first current electrode coupled to the first power supply voltage terminal, a control electrode, and a second current electrode;

a second resistor having a first terminal coupled to the second current electrode of the second transistor and a second terminal connected to a second global data line of said pair of global data lines; and selection means, coupled to the control electrode of the first transistor and the control electrode of the second transistor, for selecting the loads based on the array selected.

4. The memory of claim 2 wherein said array set comprises a first array and a second array.

5. A memory having a top and a bottom, comprising:
a pair of global data lines running from the top of the memory to the bottom;
a first array located near the top of said memory, said first array having a top and a bottom, said first array providing a pair of complementary signals to the global data lines when selected;
a second array located near the bottom of said memory, said second array having a top and a bottom, said second array providing a pair of complementary signals to the global data lines when selected;
array selection means for selecting an array from a set of arrays comprised of the first and second arrays;
a first load coupled to the pair of global data lines and located at or near the top of the first array and which is selected when the first array is selected;
a second load coupled to the pair of global data lines and located between the first array and the second array; and
a third load coupled to the pair of global data lines and located at or near the bottom of the second array and which is selected when the second array is selected.

6. The memory of claim 5 wherein said first load, said second load, and said third load each further comprises:
a first transistor having a first current electrode coupled to a first power supply voltage terminal, a control electrode, and a second current electrode;
a first resistor having a first terminal coupled to the second current electrode of the first transistor and a second terminal connected to a first global data line of said pair of global data lines;
a second transistor having a first current electrode coupled to the first power supply voltage terminal, a control electrode, and a second current electrode;
a second resistor having a first terminal coupled to the second current electrode of the second transistor and a second terminal connected to a second global data line of said pair of global data lines; and
selection means coupled to both the control electrode of the first transistor and the control electrode of the second transistor for selecting the loads based on the array selected.

7. A memory having a top and a bottom, comprising:
a pair of global data lines running from the top of the memory to the bottom;
a first array of a first plurality of memory blocks located near the top of said memory, said first array having a top and a bottom, wherein said first plurality of memory blocks are arranged from the top to the bottom of the first array, wherein each memory block of said first array provides a pair of complementary signals to the global data lines when selected;
a second array of a second plurality of memory blocks located near the bottom of said memory, said second array having a top and a bottom, wherein said second plurality of memory blocks are arranged from the top to the bottom of the second array, wherein each memory block of said second array provides a pair of complementary signals to the global data lines when selected;
array selection means for selecting an array from a set of arrays comprised of the first and second arrays in response to a first signal;
block selection means for selecting one of the memory blocks within the selected array;
a first load coupled to the pair of global data lines and located at or near the top of the first array and which is selected when the first array is selected;
a second load coupled to the pair of global data lines and located between the first array and the second array; and
a third load coupled to the pair of global data lines and located at or near the bottom of the second array and which is selected when the second array is selected.

8. The memory of claim 7 wherein said first load, said second load, and said third load each further comprises:
a first transistor having a first current electrode coupled to a first power supply voltage terminal, a control electrode, and a second current electrode;
a first resistor having a first terminal coupled to the second current electrode of the first transistor and a second terminal connected to a first global data line of said pair of global data lines;
a second transistor having a first current electrode coupled to the first power supply voltage terminal, a control electrode, and a second current electrode;
a second resistor having a first terminal coupled to the second current electrode of the second transistor and a second terminal connected to a second global data line of said pair of global data lines; and
selection means coupled to both the control electrode of the first transistor and the control electrode of the second transistor for selecting the loads based on the array selected.

9. The memory of claim 8 wherein first array and second array each further comprises eight memory blocks.

10. A memory having a top and a bottom, a read mode, and a write mode, and comprising a left half and a right half, wherein each half further comprises:
a pair of global data lines running from the top of the memory to the bottom;
a first array located near the top of said memory, said first array having a top and a bottom, said first array providing a pair of complementary signals to the global data lines when selected;
a second array located near the bottom of said memory, said second array having a top and a bottom, said second array providing a pair of complementary signals to the global data lines when selected;
array selection means for selecting an array from a set of arrays comprised of the first and second arrays;
a first load coupled to the pair of global data lines and located at or near the top of the first array and which is selected when the first array is selected;
a second load coupled to the pair of global data lines and located between the first array and the second array; and
a third load coupled to the pair of global data lines and located at or near the bottom of the second array and which is selected when the second array is selected.

11. The memory of claim 10 further comprising:

half selection means for selecting one of the first half and the second half of the memory;

enabling means for enabling at least one of the first, second, and third loads in the unselected half in the write mode.

12. In a memory with a top and a bottom a method of placing loads on the memory's data lines, comprising the steps of:

routing a plurality of global data lines from the top of the memory to the bottom;

coupling a plurality of arrays to said global data lines;

providing a plurality of loads coupled to said global data lines, wherein each of said loads corresponds to one of said plurality of arrays;

selecting one array from said plurality of arrays; and enabling the load which corresponds to said selected array.

13. In a memory comprising a left half and a right half and having a top and a bottom, a read mode, and a write mode, a method of placing loads on each half's data lines, comprising the steps of:

routing a plurality of global data lines from the top of the memory to the bottom;

coupling a plurality of arrays to said global data lines;

providing a means for selecting one array from said plurality of arrays in a read mode;

providing a plurality of loads coupled to said global data lines;

associating a pair of loads with each of said arrays; and enabling two loads based on the array selected, said two loads to be the ones associated with the selected array.

14. The method of claim 13 in which the write mode comprises the steps of:

selecting one half of the memory in the write mode; and enabling one load in an unselected half.

* * * * *